United States Patent [19]

Smith

[11] Patent Number: 5,406,836

[45] Date of Patent: Apr. 18, 1995

[54] EGR SYSTEM TESTING DEVICE

[76] Inventor: James N. Smith, 10602 Runyan Lake Rd., Fenton, Mich. 48430

[21] Appl. No.: 147,307

[22] Filed: Nov. 5, 1993

[51] Int. Cl.$^6$ .................... G01M 19/00; G01R 31/06
[52] U.S. Cl. ................................... 73/118.1; 324/546
[58] Field of Search ........................... 73/118.1, 117.3; 123/571; 324/546, 555, 556

[56] References Cited

U.S. PATENT DOCUMENTS

| | | | |
|---|---|---|---|
| 4,402,217 | 9/1983 | Migashiyama | 73/117.3 |
| 4,794,790 | 1/1989 | Margarit-Metaxa et al. | 73/117.3 |
| 5,103,655 | 4/1992 | Kano et al. | 73/118.1 |
| 5,137,004 | 8/1992 | Takahata et al. | 123/571 |
| 5,140,961 | 8/1992 | Sawamoto et al. | 123/419 |
| 5,152,273 | 10/1992 | Ohuchi | 123/571 |
| 5,153,522 | 10/1992 | Sano | 324/546 |
| 5,154,156 | 10/1992 | Ohuchi | 123/571 |
| 5,168,238 | 12/1992 | Larance | 324/556 |

OTHER PUBLICATIONS

Cardone On-Car Electronic Circuit Analyzer advertisement, p.A137, Motor Magazine, Oct. 1993.
Snap-On Tools catalog 1991-92, pp. 360,363.

Primary Examiner—Richard E. Chilcot, Jr.
Assistant Examiner—James M. Olsen
Attorney, Agent, or Firm—Young, MacFarlane & Wood

[57] ABSTRACT

An exhaust gas recirculation (EGR) valve testing device is provided in a configuration to be utilized with a variety of motor vehicles. The portable device is adaptable, through a collection of interchangeable wiring harnesses, for connection to a wide variety of vehicles of various manufacture. A plurality of independent EGR solenoids may be selectively operated and tested by the selective operation of a plurality of switches incorporated in the invention. Operation of the invention also provides visual feedback of the position of the EGR solenoid pintle. The invention is also equipped with external signal outputs for operating external test devices.

5 Claims, 3 Drawing Sheets

EGR SYSTEM TESTING DEVICE

BACKGROUND OF THE INVENTION

1. Field of the Invention

This invention is an improved portable exhaust gas recirculation testing device, suitable for use in a wide variety of motor vehicles.

2. Description of the Prior Art

Most automotive vehicles of recent manufacture are equipped with engine emission control systems utilizing exhaust gas recirculation (EGR) valves. The EGR valve directs a portion of the motor vehicle's exhaust gas back through the engine's air intake system, thereby reducing nitrous oxides in vehicle exhausts. Vehicle EGR systems are subject to failure, resulting in decreased efficiency of the emissions control system. Because EGR system failures do not always produce a noticeable degradation in the performance of the vehicle, such failures often go unnoticed. Under these circumstances, the affected automobile appears to operate correctly, while producing a higher than acceptable level of exhaust gas emissions.

Many government regulatory agencies now impose strict limits on the amount of certain emissions which can be present in motor vehicle exhaust gases. To insure compliance with these emission requirements, government agencies frequently impose a periodic inspection requirement on motor vehicles, mandating annual evaluation of the motor vehicle exhaust to determine whether or not it is within the limits prescribed by the appropriate regulation or statute.

Vehicle emissions testing is frequently performed by a wide variety of automobile service facilities. These may include the repair facilities of authorized motor vehicle distributors, as well as independent service stations and repair shops. In some states in the United States, exhaust gas recirculation system testing requires a detailed diagnosis of the function of exhaust gas recirculation solenoids which control the operation of exhaust gas recirculation valves.

A variety of diagnostic devices for EGR systems have been proposed and implemented. Often, EGR testing is performed in the vehicle, as taught by Sawamoto et al., U.S. Pat. No. 5,140,961. Additionally, simple portable devices for manually activating and deactivating the exhaust gas recirculation valves have been used.

Many existing motor vehicles are not equipped with on-board diagnostic EGR testing, and in many cases, the on-board diagnostic systems do not perform tests suitable for the certification of EGR systems operations as required by government regulation and statute. Further, the simple portable testing devices heretofore used are typically incapable of operating in the test environment for a wide variety of motor vehicles, and fail to provide feedback to the test operator to verify that the operation of the EGR valves has been complete.

SUMMARY OF THE INVENTION

It is an object of the present invention to provide an improved portable diagnostic testing device for EGR valves. Specifically, the present invention overcomes numerous drawbacks of the prior art, providing a test device which is easily adapted to a wide variety of motor vehicles, regardless of year of manufacture or make. Additionally, the present invention allows individual testing of multiple EGR valves, while providing a positive indication of the functionality of the EGR system under test.

DETAILED DESCRIPTION OF THE INVENTION

Figure 1:
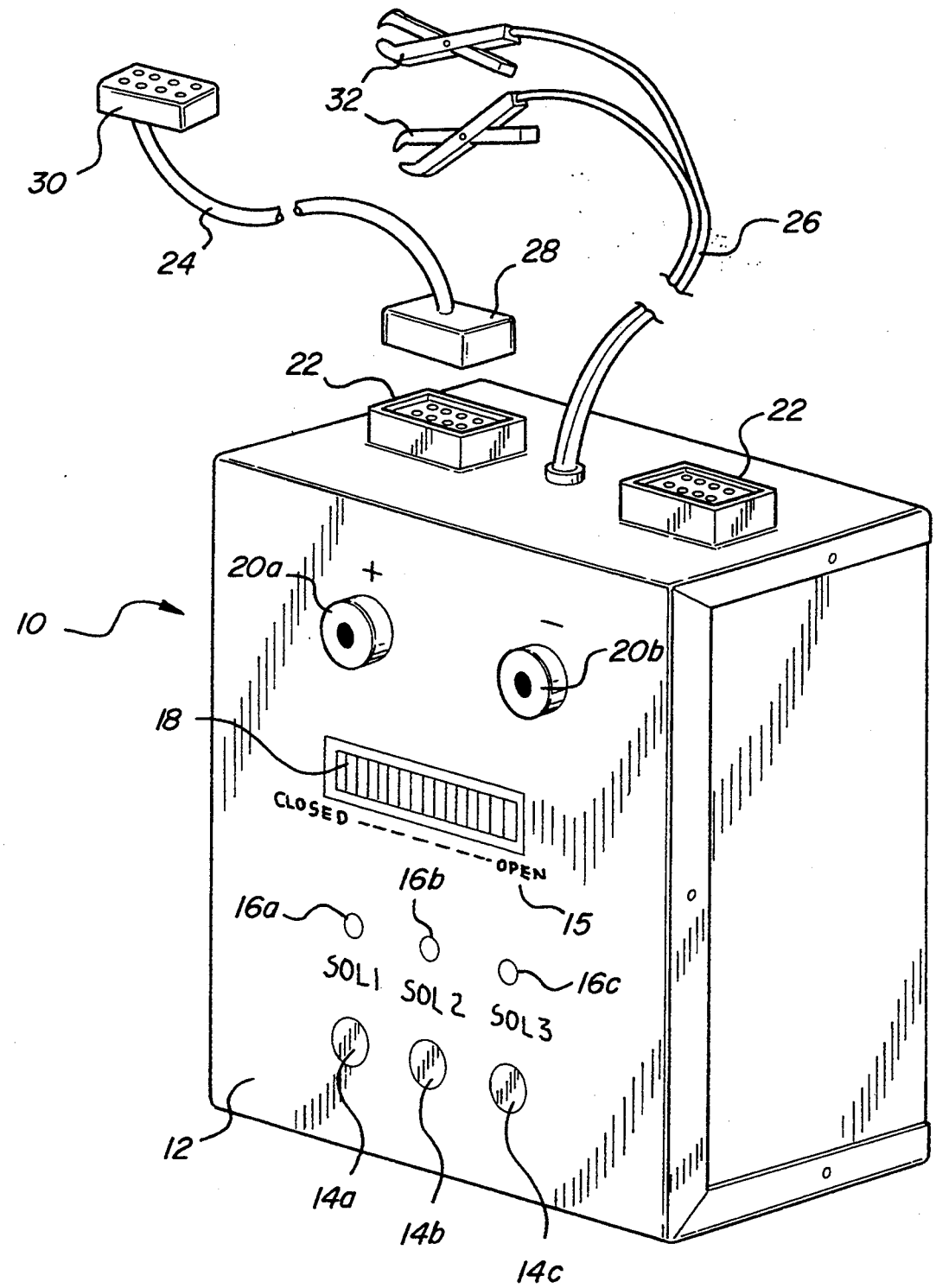
FIG. 1 is a perspective view of the exterior of the invention, including the wiring harnesses and electrical connections.

Referring now to FIG. 1, an embodiment of the EGR valve test device 10 is represented in perspective view. In this embodiment, an enclosure 12 of rectangular cross-section is provided with a plurality of operating switches 14a, b and c, a corresponding plurality of indicators 16a, b and c, a voltage indicator 18, voltage output jacks 20a, b, wiring harness connectors 22, wiring harness 24 and a power input cord 26 provided with clip-on connectors 32.

In the preferred embodiment, the enclosure 12 is manufactured of a rugged material suitable for protecting an electronic circuit board contained therein. Suitable materials may be high impact plastics or sheet metal. The indicators 16 are preferably in the form of light emitting diodes and which are favored because of their reliability and long life. However, any visual display indicator may be used, including conventional incandescent lamps 16, electro mechanical indicators and the like. Each indicator corresponds to a momentary switch 14. To assist in determining the functionality of the EGR solenoid valves, a variable voltage indicator 18, preferably in the form of a bar graph-type display is disposed on one surface of the enclosure. Electronically in parallel with the inputs to this voltage indicator are a pair of voltage output jacks 20a, b, whereby an external test device, such as a volt meter, may be electronically connected to the invention for purposes of monitoring with more precision the voltage displayed on the volts indicator 18.

To facilitate connection of the invention to motor vehicle EGR systems, one or more connectors 22 are provided, disposed in such a fashion as to be at least in part, exposed to the exterior of the enclosure, while communicating with the electronic circuit contained there within. Connectors 22 are preferably of the quick release type, such as Molex ®, thereby permitting a variety of harnesses 24 to be quickly attached and removed from the device 10. A plurality of harnesses 24 is provided for the invention. Individual harnesses are pre-wired for specific vehicles, insuring correct electrical connection between the invention and the vehicle under test. A first end 28 of each said harness is mated to the connector of the invention, while the second end 30 of the harness 24 is equipped with the necessary electrical connections to allow the harness 24 to be easily and quickly connected and disconnected from the electronic connectors mounted on the EGR valves within the motor vehicle being tested. The power cord 26 is designed to electronically connect the invention to an external power source, such as a motor vehicle battery. In the preferred embodiment, one end of the power cord is connected to the electronic circuitry within the enclosure of the invention, while the other end is provided with clip-on connectors, such as alligator clips 32, or similar suitable reusable quick disconnecting devices for purposes of attachment to the motor vehicle battery or other readily available power supply within the engine compartment of the motor vehicle.

Overall, the invention is of suitable size and weight as to be easily portable and carried by a technician from motor vehicle to motor vehicle.

Figure 2:
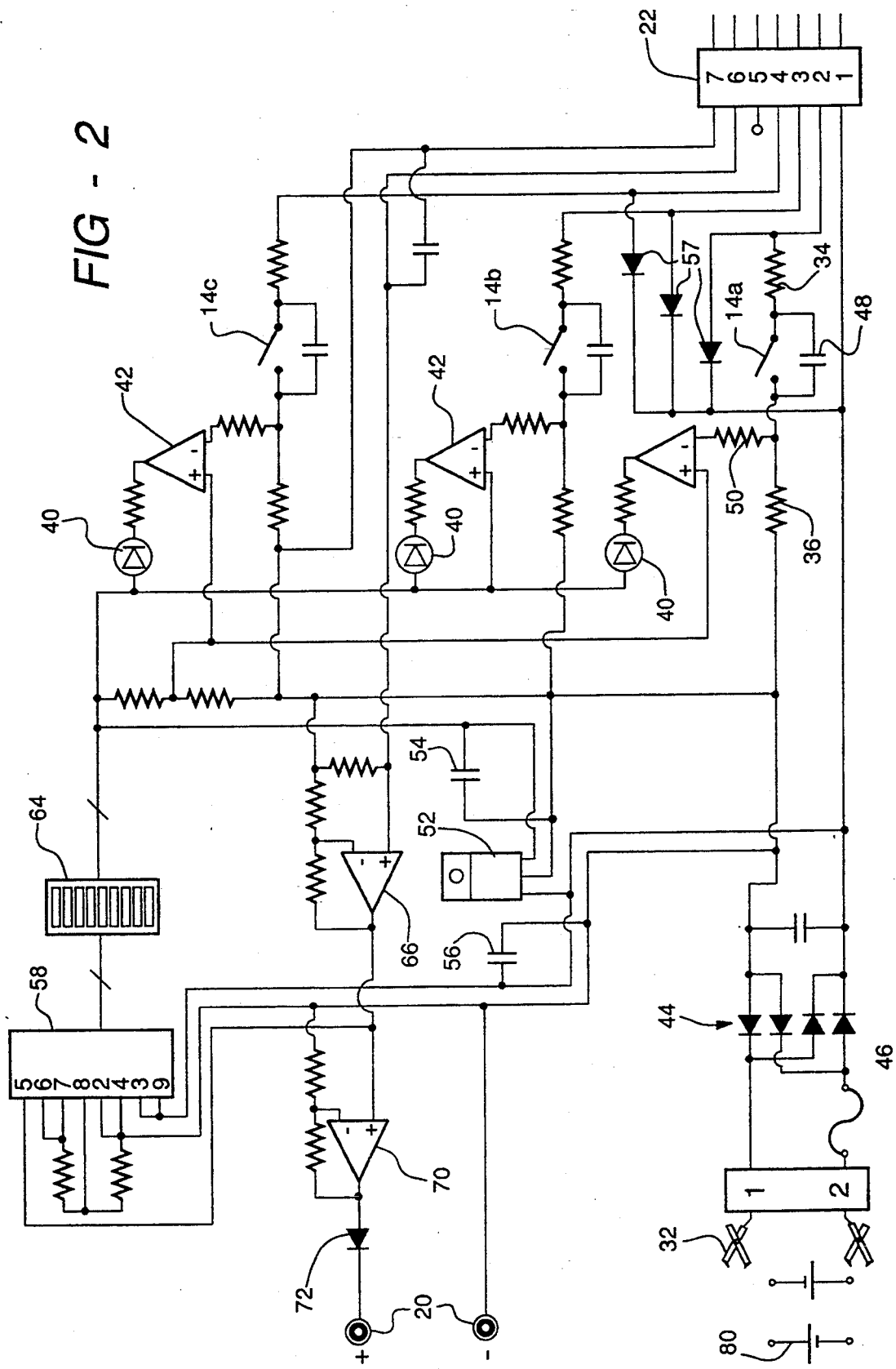
FIG. 2 is a electrical schematic of the operating circuit of the invention.

The operation of the circuit can best be understood by reference to FIG. 2, a schematic diagram showing each of the components.

Power for the tester is preferably derived from the battery 80 of the vehicle being tested. Clip-on connectors 32 are provided to facilitate connection and disconnection of the electrical source power. A fuse 46 protects the entire circuit power leads, and the integrity of the polarity of the circuit is preserved by a conventional diode bridge 44. 12 volt vehicle power is provided directly to test harness output connector 22 pin 1 to provide 12 volt DC source voltage to the vehicle exhaust gas recirculation solenoids to be tested. 12 volt power is also supplied to the display driver 58 and to the input of 5 volt integrated regulator/power supply 52, which provides regulated 5 volt DC current to power the remainder of the circuit. Capacitors 54 and 56 suppress noise from the DC power supply circuit.

Each of up to three EGR solenoids may be activated directly by closure of switches 14a, 14b or 14c. Operation of each of three discrete circuits associated with switches 14a, 14b and 14c is identical, and only the first of these three circuits is described herein. Closure of switch 14a completes a circuit to ground across thermistors 34 and resistor 36 for the solenoid under test. Capacitor 48 suppresses transient voltage variations on switch opening and closure. Switch closure also results in illumination of LED 40 powered by the outputs of comparator 42. A solenoid pintle position voltage in the form of a zero to 5 volt signal is presented to the input of one-half of the dual operational amplifier 66, 70 integrated circuit. The output of this half 66 of the circuit 66, 70 provides the appropriate input to display driver 58 as well as the second half 70 of the dual operational amplifier 66, 70. The output of this second half of dual amplifier 66, 70 is presented, through a diode isolator circuit 72, to output jacks 20 on the EGR test case suitable for connection to an external voltmeter. The voltage presented to the display driver 58 is converted to a ten-bar LED-type display 64, in which the number of bars illuminated represent the voltage presented to the display. Each segment of the display represents 0.5 volts.

Diode 57 protects comparator 42 from damage upon opening switch 14a, when the magnetic field of the solenoid in the EGR valve under test collapses.

Figure 3:
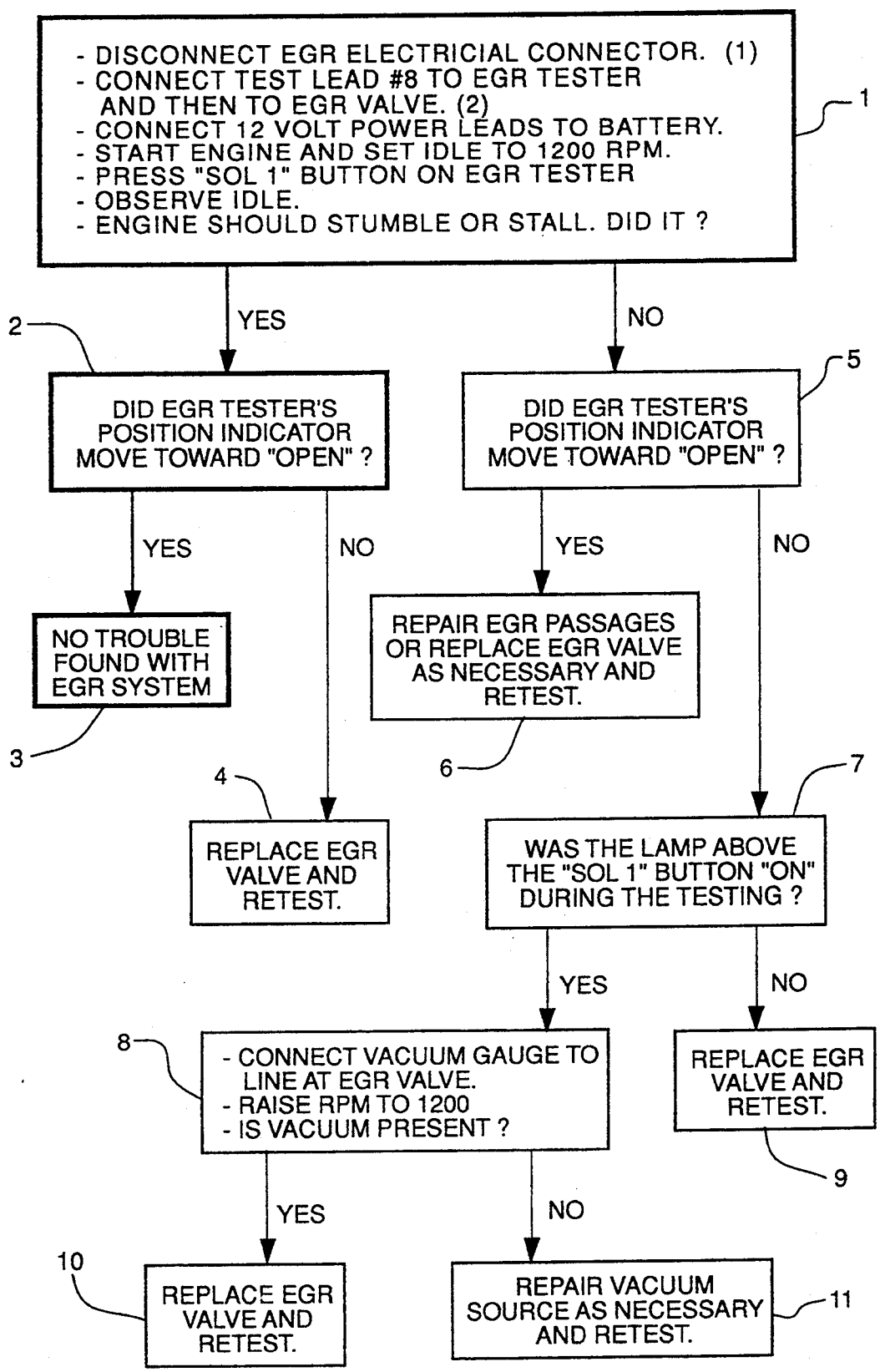
FIG. 3 is a troubleshooting flow chart outlining typical operation of the invention.

In operation, harness 24 is connected by virtue of a suitable electrical connector to the vehicle EGR solenoid. Plug 28 is attached to connector 22 to complete the electrical connection between the invention and the motor vehicle under test. Motor vehicle engine is then started and brought to normal operating temperature. 12 volt power is supplied to the invention by connection of the clip-on connectors 32 to the motor vehicle battery or comparable 12 volt power source. With the vehicle engine operating at idle, the operator depresses switch 14a to affect activation of the first EGR solenoid. Operation of the EGR solenoid in this fashion will cause the motor vehicle engine to stall or misfire, indicating correct operation of the EGR solenoid. In the event that operation of the switch 14a does not result in any change in vehicle engine operation, it can be concluded that the EGR valve solenoid is inoperative, and further diagnosis of the system is required. Simultaneously with operation of switch 14a, the associated indicator 16a will illuminate, providing visual feedback of the application of power to the solenoid. Likewise, the application of power to the EGR solenoid through switch 14a results in a pintle position signal being transmitted through connector 22 to display driver 58, providing a visual display of the pintle position. Proper engine operation is indicated by a successive illumination of the bar graph display. A legend 15 below the bar graph display explains the meaning of the illumination of the various elements of the display. An increase in the number of bar graph elements illuminated during vehicle test corresponds to movement of the solenoid pintle from the closed to the open position. A more detailed flow diagram of this typical trouble-shooting procedure is set forth in FIG. 3. As shown, a simple branching diagram with subsequent actions dictated by positive or negative responses regulates the diagnostic procedure. After initial connection of the harness 24 to the vehicle EGR solenoid, outlined in box 1, the engine should stumble or stall as explained above. If so, box 2 directs the operator to determine whether or not the present invention's solenoid pintle position indicator moved toward the open position. If it did, the vehicle EGR system is functioning properly 3. If the indicator fails to respond, the EGR valve should be replaced and the vehicle retested 4. In the event that the engine did not stumble or stall, the operator is directed to box 5, which requires the operator to determine whether or not the present invention's pintle position indicator move toward the "open" position 5. If so, either the EGR passages require repair or the vehicle EGR valve needs to be replaced 6. If the pintle position indicator failed to move toward the "open" position, the operator is directed to determine whether or not the LED indicator 40 (FIG. 2) above the appropriate corresponding switch 14a, 14b, or 14c (FIG. 1) was eliminated during testing of the vehicle EGR valve 7. If not, it is necessary to replace and retest the vehicle EGR valve 9. If the LED indicator was eliminated, the operator is instead directed to conduct a vacuum test of the EGR valve 8. If this test indicates the presence of a vacuum, the vehicle EGR valve should be replaced and retested 10. If there is no vacuum in response to this test, the vacuum source should be repaired and the vacuum test retried 11.

I claim:

1. In a hand-held, portable device for testing the operation of an electronically controlled EGR valve having a solenoid, said solenoid having a pintle-position responsive signal output, the improvement comprising:
   A. A plurality of independently operating switches;
   B. A plurality of visual indicators, one of each said indicators uniquely associated with one of each said switches;
   C. A voltmeter responsive to said pintle-position signal output;
   D. Circuit means responsive to each of said plurality of switches, whereby closure of each said switch energizes said EGR valve solenoid;
   E. Second circuit means responsive to the operation of each said switches and said solenoid, whereby closure of said switches and said solenoid, whereby closure of said switch and desired operation of said solenoid affects operation of said uniquely associated indicator; and F. Third circuit means responsive to each of said plurality of switches, whereby closure of said switch affects operation of a voltmeter responsive to said pintle-position signal output, causing an indication on said voltmeter in proportion to the physical position of the pintle of said solenoid.

2. The invention of claim 1, wherein said device further comprises at least one voltage output jack suitable for connecting said device to an external voltmeter.

3. A device according to claim 1, which further comprises a plurality of removal and interchangeable wiring harnesses, one end of each said harness adapted to be removably attached to said device, and the other end of said harness adapted to be removably attached to said EGR valve.

4. The invention of claim 3, wherein said device further comprises at least one output jack suitable for connecting said device to an external testing device.

5. The invention of claim 4, wherein said external testing device is a volt meter.

* * * * *

UNITED STATES PATENT AND TRADEMARK OFFICE
CERTIFICATE OF CORRECTION

PATENT NO. : 5,406,836
DATED : April 18, 1995
INVENTOR(S) : Smith

It is certified that error appears in the above-indentified patent and that said Letters Patent is hereby corrected as shown below:

Column 2, line 33, delete "mechanical" and insert -- mechanic--;

Column 3, line 50, delete "0.5" and insert --.5--;

Column 4, line 66, delete "whereby closure of said switches and said solenoid,".

Signed and Sealed this

Seventh Day of May, 1996

Attest:

BRUCE LEHMAN

Attesting Officer

Commissioner of Patents and Trademarks